United States Patent [19]

Schoofs et al.

[11] Patent Number: 5,412,234
[45] Date of Patent: May 2, 1995

[54] INTEGRATED SEMICONDUCTOR CIRCUIT HAVING IMPROVED BREAKDOWN VOLTAGE CHARACTERISTICS

[75] Inventors: Franciscus A. C. M. Schoofs; Adrianus W. Ludikhuize, both of Eindhoven, Netherlands

[73] Assignee: U.S. Philips Corporation, New York, N.Y.

[21] Appl. No.: 297,272

[22] Filed: Aug. 26, 1994

Related U.S. Application Data

[63] Continuation of Ser. No. 94,801, Jul. 20, 1993, abandoned.

[30] Foreign Application Priority Data

Jul. 20, 1992 [EP] European Pat. Off. ........... 92202209

[51] Int. Cl.[6] .......................................... H01L 29/80
[52] U.S. Cl. .................................... 257/256; 257/265; 257/272
[58] Field of Search .......................... 257/256, 265, 272

[56] References Cited

U.S. PATENT DOCUMENTS 4,494,134  1/1985  Wildi et al. ....................... 357/43
4,925,808  5/1990  Richardson ........................ 257/256

OTHER PUBLICATIONS

"A 700-V Interface IC For Power Bridge Circuits" Schoofs et al, IEEE Journal Of Solid State Circuits, vol. 25, No. 3, Jun. 1990.

*Primary Examiner*—Mark V. Prenty
*Assistant Examiner*—Stephen D. Meyer
*Attorney, Agent, or Firm*—Steven R. Biren

[57] ABSTRACT

It is possible to limit the voltage across a diode to the level of the pinch-off voltage of a JFET in an integrated circuit by connecting the diode in series with the JFET. As a result, the voltage offered through the JFET can be higher than the breakdown voltage of the diode, which is of particular importance in high-voltage ICs in which a highly doped buried zone is formed below the diode for reducing leakage currents to the substrate. According to the invention, the JFET together with at least one further circuit element is formed in a common island surrounded by an island insulation region. The gate of the JFET extends along the edge of the island and is separated from the relevant portion of the island insulation region substantially only by the source of the JFET. In the pinch-off condition, the gate divides the island into a high-voltage portion and a low-voltage portion which is coupled to the diode. The diode with the JFET occupies very little space and can be readily incorporated in integrated circuit designs.

8 Claims, 2 Drawing Sheets

INTEGRATED SEMICONDUCTOR CIRCUIT HAVING IMPROVED BREAKDOWN VOLTAGE CHARACTERISTICS

This is a continuation of application Ser. No. 08/094,801, filed Jul. 20, 1993, now abandoned.

BACKGROUND OF THE INVENTION

The invention relates to an integrated semiconductor circuit comprising a semiconductor body with a layer-shaped region of a first conductivity type adjoining a surface and limited at the side remote from the surface by a region, called substrate hereinafter, of the second conductivity type opposite to the first conductivity type, one or several insulated islands being formed in the layer-shaped region with one or several circuit elements comprising at least a diode with a first main electrode region in the form of a surface zone of the second conductivity type provided in the layer-shaped region and with a second main electrode region of the first conductivity type comprising a portion of the layer-shaped region adjoining the first main electrode region and connected to a source region of a junction field effect transistor (JFET) whose channel is formed by a portion of the layer-shaped region situated adjacent the diode. Such a device is known, for example, from U.S. Pat. No. 4,494,134.

In most versions, the layer-shaped region is formed by an n-type surface layer of silicon which was deposited epitaxially on a p-type silicon substrate. The islands are usually separated from one another by interposed p-type zones which extend from the surface transversely through the thickness of the epitaxial layer (referred to as epi layer hereinafter for short). In the case of high-voltage circuits, for which the invention is of particular importance, and where the thickness of the epi layer may be very considerable, for example 20 μm, these zones may be composed from a surface zone and a buried zone. Obviously, the island insulation may be formed in a different manner completely or partly, for example, by means of dielectric insulation. The diode may be used purely as a rectifier, for example, in the case of a so-called bootstrap in which a junction point in the circuit is charged to a certain comparatively low voltage through the diode and subsequently is brought to a high voltage level, which may be higher than the supply voltage, by means of a capacitive coupling. The first main electrode region formed by a p-type surface zone then forms the anode while the second main electrode region formed by the n-type epi layer forms the cathode. In alternative versions, the diode may form part of a circuit element, for example, the base-collector junction of a bipolar transistor in which an n-type zone forming the transistor emitter is provided in the zone which forms the said first main electrode region and which is of the p-type when the epi layer is of the n-type.

The U.S. Pat. No. 4,494,134 cited above describes a diode in which a highly doped buried n-type layer is provided between the n-type epi layer and the p-type substrate, below the anode. It is an object of this buried layer to suppress the parasitic pnp action to the substrate when the diode is forward biased. Simultaneously, the breakdown voltage of the pn junction may be strongly reduced as a result of the buried layer, so that the diode breaks down in the reverse direction at a voltage which is too low for many applications. To avoid this problem, a p-type surface zone is provided between the anode and the cathode, forming the gate of a junction field effect transistor or JFET whose source is formed by the n-type region around the anode and whose drain is formed by the cathode in the form of an n-type zone surrounded by the gate electrode. The gate is in its turn surrounded by the anode which is provided along the edge of the island. When a voltage is supplied through the drain, the source will follow until the channel of the JFET is pinched off. A further increase of the voltage at the drain will not or hardly not lead to an increase in the voltage at the source. In this manner the voltage across the diode in the reverse direction can be limited to a comparatively low value, i.e. the pinch-off voltage of the JFET. A disadvantage of the known device is that it occupies disproportionately much space, especially when the anode itself is surrounded in the epi layer by a cup-shaped n+ zone for preventing lateral injection of holes into the island insulation. In addition, a diode of only a small surface area is often required, which in the concentric configuration described here, with the anode situated at the outside, is difficult to realize.

SUMMARY OF THE INVENTION

The invention has for its object inter alia to provide a configuration which occupies less space than the known device, while the properties as regards breakdown voltage and low parasitic substrate currents are retained.

According to the invention, an integrated semiconductor circuit of the kind described in the opening paragraph is characterized in that the junction field effect transistor comprises a drain region which is formed by an island which at the same time forms a zone of at least one further circuit element and which is laterally bounded by an island insulation region, the junction field effect transistor comprising a gate region of the second conductivity type extending at the edge of the island and separated from an adjacent portion of the island insulation region by substantially an interposed region of the first conductivity type belonging to the source region of the JFET. A major embodiment is characterized in that the gate region locally adjoins the island insulation region and in conjunction therewith divides the island into two portions which can be insulated from one another. The invention is based inter alia on the recognition that the said island, in the situation in which the channel below the gate region is entirely pinched off, is in fact divided into two separate partial islands which may be brought to different potentials and which are insulated from adjacent portions of the epi layer, partly by the said island insulation region, partly by the field effect action in the channel region of the JFET between the two partial islands. In such a configuration, the gate region may be formed simply by a straight, strip-shaped zone. A closed, ring-shaped gate is accordingly not necessary in all circumstances. The diode may be provided in any desired shape and may thus occupy comparatively little space, while it can in addition be readily incorporated into the design of the integrated circuit.

The invention is of particular, though not exclusive importance for high-voltage circuits.

At the area of the JFET, the layer-shaped region may be thinner than in adjoining portions, and the gate region may be formed by a subjacent portion of the substrate. In a further embodiment, the island insulation region may be formed by dielectric material or by groove insulation. A preferred embodiment is characterized in that the gate region of the junction field effect transistor comprises a surface zone of the second conductivity type which extends from the surface into the layer-shaped region of the first conductivity type over part of the thickness of this region and which is connected to the substrate of the second conductivity type via adjoining portions of the island insulation region which are formed by a zone of the second conductivity type extending throughout the entire thickness of the layer-shaped region. The gate region of the JFET is here connected to the substrate, which is usually at a fixed potential, via the island insulation and need accordingly not necessarily be provided with a separate connection. An important embodiment of a semiconductor circuit according to the invention is characterized in that the layer-shaped region of the first conductivity type is formed by an epitaxial layer provided on the substrate, the zone of the second conductivity type which forms part of the island insulation region and extends throughout the entire thickness of the layer-shaped region being composed of a zone provided from the surface and from a buried zone provided at the interface between the substrate and the epitaxial layer. In this embodiment, the gate region may be formed, for example, simultaneously with the surface zone of the island insulation, while the buried zone of the island insulation is omitted in the channel region of the JFET.

For high-voltage applications, the RESURF principle (REduced SURface Fields) generally known from the literature may advantageously be used, the thickness and the doping concentration of the layer-shaped region or of the epi layer being so chosen that the layer-shaped region is depleted over its entire thickness, at least locally, before breakdown has occurred. It is known that, owing to these depletion zones, electric fields which may be very strong locally, for example at blocked pn junctions, can be considerably reduced, so that the voltage can be raised to practically the theoretical maximum value. A further embodiment of a semiconductor circuit according to the invention is characterized in that the island insulation region is provided, at the edge adjoining the island, with a breakdown voltage increasing ring which extends along the circumference of a portion of the island situated at the drain side of the JFET and along the edge of the gate region facing towards the drain region. In this case the layer-shaped region can be depleted both from the substrate side and from the surface by the voltage increasing ring. This two-sided depletion renders it possible to choose the doping concentration and/or the thickness of the layer-shaped region to be greater than in the case of a single-sided depletion from, for example, the substrate side only. It should be noted in this connection that the voltage raising ring need only be provided in the partial island which is situated at the drain side and to which a high voltage is applied, and not to the other partial island which is insulated from the former partial island by the blocked JFET and which is at a much lower voltage. Since the island need be provided with a voltage raising ring along part of its circumference only, a considerable space saving can be achieved.

The invention is of particular importance in a semiconductor circuit in which below the surface zone of the second conductivity type forming the first main electrode region of the diode, as seen at the surface, a zone of the first conductivity type is provided at the interface between the substrate and the layer-shaped surface region having a higher doping concentration than the layer-shaped region, so as to extend into the layer-shaped region at most over only part of the thickness of this region. The buried, highly doped zone suppresses or reduces parasitic transistor effects between the diode zone and the substrate, as was noted above, but also reduces the breakdown voltage of the diode. The use of the JFET in series with the diode prevents a voltage greater than the breakdown voltage from being applied across the pn junction of the diode. A preferred embodiment in which parasitic transistor effects through the island insulation are also suppressed is characterized in that the surface zone of the second conductivity type forming the first main electrode region of the diode is surrounded, as seen at the surface, in the layer-shaped region by an annular zone of the first conductivity type having a higher doping concentration than the layer-shaped region. For a good operation of the device, for example, as a bootstrap circuit, it is usually desirable for the ON-resistance of the JFET to be as small as possible in the case of a conducting diode, or in other words for the JFET to have a channel of great width. A favorable embodiment in which a low ON-resistance is obtained without much space being lost is characterized in that the island is substantially rectangular while, seen at the surface, the gate region of the transistor extends parallel to one of the sides of the rectangle in the island.

BRIEF DESCRIPTION OF THE DRAWING

The invention will be explained in more detail with reference to an embodiment and the accompanying diagrammatic drawing, in which.

DESCRIPTION OF THE PREFERRED EMBODIMENTS

Figure 1:
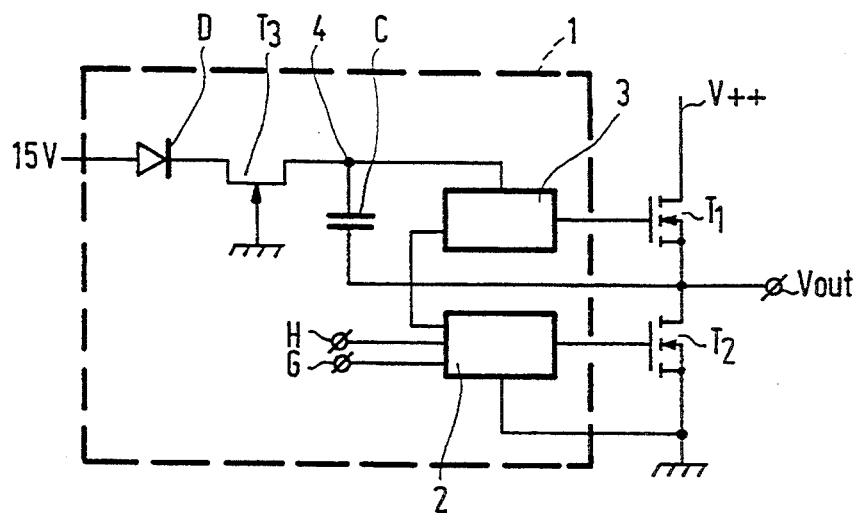
FIG. 1 is a diagram of a half bridge circuit comprising an integrated semiconductor circuit according to the invention.

FIG. 1 shows in a simplified form the diagram of a half bridge circuit which may be used, for example, as a ballast circuit for gas discharge lamps and which uses an integrated circuit according to the invention. In the description below, mainly those elements of the circuit, surrounded by broken lines in FIG. 1, will be mentioned which can be of advantage for a better understanding of the present invention. For a more detailed description, the reader is referred to the article by Schoofs and Dupont "A 700-V Interface IC for Power Bridge Circuits", published in IEEE Journal of Solid-State Circuits, vol. 25, no. 3, June 1990, pp. 677/682, in which a similar circuit is described, though not fully integrated into a monocrystalline silicon body.

The bridge circuit comprises two n-channel MOS transistors $T_1$ and $T_2$ connected in series between a high supply $V_{++}$ and a low supply, for example, ground. The junction point between the transistors is connected to an output terminal $V_{out}$. This terminal may be connected to, for example, an inductive load as used for a gas discharge lamp. The output voltage is alternately high and low with a frequency of, for example, 25 kHz, which is achieved in that the transistors $T_1$ and $T_2$ are made conducting and non-conducting in counterphase, so that $V_{out}$ is alternately connected to $V_{++}$ and to ground. $V_{++}$ may be several hundred Volts, for example, 700 V. The integrated circuit 1 comprises a low-voltage block 2 which in its turn may comprise various functional blocks, such as a logic control block which processes the input signals H and G and generates desired control signals, a level shifter which brings the control signals to a suitable voltage level, and a block which is coupled to the gate electrode of $T_2$. The block 3 is coupled to the gate of $T_1$ and operates at high voltage, at least when $T_1$ is on.

To ensure that the voltage level at the gate of $T_1$ can be positive relative to $V_{++}$ when $T_1$ is on, a so-called bootstrap is provided comprising the capacitor C and the diode D. One plate of the capacitor is connected to the output $V_{out}$, the other plate to the cathode of diode D (through transistor $T_3$) on the one hand, and to the gate electrode of $T_1$ on the other hand, possibly via block 3. The anode of diode D is connected to a point with a fixed voltage, for example, 15 V. The operation of the bootstrap is as follows: when $T_1$ is off and $T_2$ is on, $V_{out}$ is low. The junction point 4 is charged through the diode D to 15 V, or at least to approximately 15 V. When subsequently $T_2$ is switched to the off-state, the voltage at the output terminal $V_{out}$ can rise quickly, especially in the case of an inductive load, to or almost to the voltage $V_{++}$. This voltage rise is passed on to the junction point 4 through the capacitor C, the voltage at point 4 being capable of rising far above the voltage at the anode of diode D and even to a value higher than the supply $V_{++}$. This voltage is passed on through block 3 to the gate electrode of $T_1$, which renders $T_1$ conducting. The output voltage $V_{out}$ taken off at the source of $T_1$, and accordingly lower than the gate voltage by at least the threshold voltage $V_{th}$, can rise to practically $V_{++}$ owing to the high voltage at the gate.

If the junction point 4 were connected directly to the cathode of diode D, a very high voltage in the reverse direction would be applied across the diode. Since the diode D would have to be resistant to such high voltages, this would require an adaptation of the diode which in its turn would lead to disadvantages in other respects, particularly as regards the current to the substrate. To avoid these problems, a junction field effect transistor $T_3$, also called JFET hereinafter, is connected between the cathode of the diode and the junction point 4. The source of $T_3$ is connected to the cathode of the diode, the drain to the junction point 4 and the high-voltage block 3, and the gate region of $T_3$ is connected to ground. When the voltage at point 4 is high, the voltage at the cathode of the diode D will not, or at least hardly become higher than the pinch-off voltage of the JFET $T_3$. This transistor may be so manufactured that the pinch-off voltage is lower than the breakdown voltage of the diode D. This renders it possible to accommodate practically the entire circuit surrounded by the broken line 1 in a single monolithic circuit. The capacitor C, which could in principle also be integrated, will in practice be constructed as an external discrete component because of its large dimensions.

Figure 2:
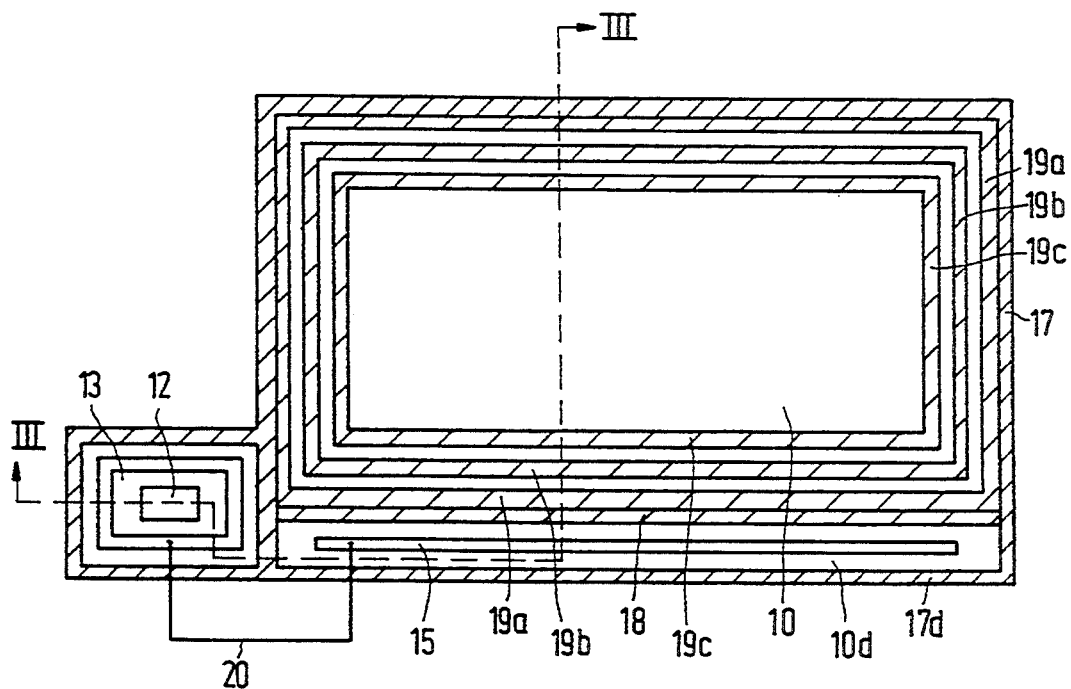
FIG. 2 is a plan view of a portion of a first embodiment of this integrated circuit.
Figure 3:
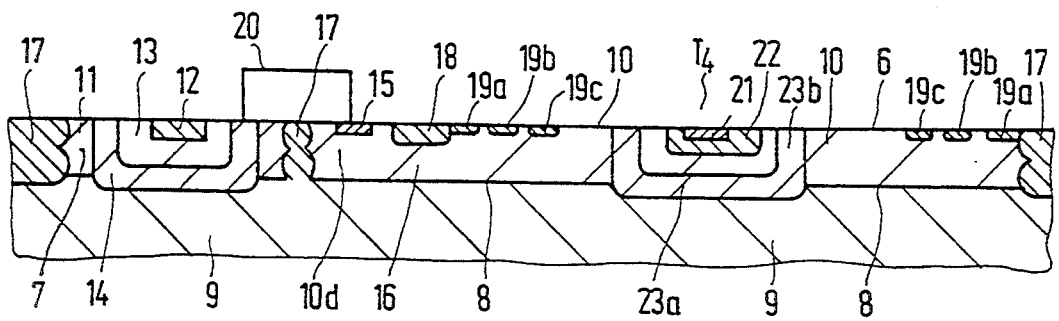
FIG. 3 is a cross-section taken on the line III—III in FIG. 2.

A plan view and a cross-section of a first embodiment of this monolithic circuit are shown in FIGS. 2 and 3, respectively. The integrated circuit comprises a semiconductor body 5 which is usually made of silicon, but which may obviously also comprise a different suitable semiconductor material. The body 5 comprises a layer-shaped region 7 of a first conductivity type, in the present example the n type, which adjoins the surface 6 and which at the side remote from the surface 6 merges into a region 9, called substrate hereinafter, of the opposite conductivity type, so the p type, via a pn junction 8. The layer-shaped region is formed in this example by an approximately 22 μm thick epitaxial layer with a resistivity of approximately 6 Ω.cm grown on a p-type substrate having a resistivity of approximately 90 Ω.cm. Obviously, the layer-shaped region 7 may be formed not only by epitaxy but also by a re-doped surface layer of the substrate by means of implantation of an n-type dopant. At least two islands 10 and 11 insulated from adjoining portions of the semiconductor body are formed in the epi layer 7. The diode D is provided in the island 11 as the only circuit element, while the high-voltage block 3 of FIG. 1 may be wholly or partly accommodated in the island 10. A bipolar transistor $T_4$ is drawn in the island 10 by way of example, but it will be obvious without further explanation that alternative circuit elements may also be provided in this island.

The diode D comprises a first main electrode region in the form of a p-type surface zone 12 forming the anode of the diode and provided in the epi layer 7. The cathode of the diode is formed by the n-type region 13 which surrounds the anode in the semiconductor body and comprises a portion of the epi layer 7. To prevent a major portion of the holes injected into the cathode when the diode is forward biased from disappearing into the substrate (parasitic pnp effect), a highly doped n-type cup-shaped zone 14 is provided around the anode at a distance therefrom, which zone has a higher doping level than the epi layer. The said parasitic pnp effect to the substrate is suppressed by the portion of the cup-shaped zone which forms the bottom of the cup. The upright walls of the cup-shaped zone in addition prevent lateral injection of holes into the island insulation 17 at least to a great extent. The breakdown voltage of the diode 12/13, however, is very strongly reduced by the zone 14, too strongly for inter alia the application shown in FIG. 1. To prevent an excessive voltage being applied across the diode, the cathode 13/14 is connected to the source 15 of the JFET $T_3$ whose drain, to which the high voltage is applied, is separated from the source 15 by the channel of the JFET. The channel is formed by a portion 16 of the epitaxial layer laterally separated from the cathode.

According to the invention, the drain of the transistor $T_3$ is formed by the high-voltage island 10 which next to the JFET $T_3$ also forms a zone of at least one further circuit element, in the example shown the collector of the bipolar transistor $T_4$.

The island 10 is insulated from adjacent portions of the epitaxial layer by an island insulation region 17 which in this example is formed by a p-type zone which extends laterally through the thickness of the epitaxial layer. Because of the great thickness of the epitaxial layer, the island insulation region in this example is composed of a zone provided from the surface and a zone provided as a buried zone at the interface of the epi layer and the substrate. For thinner epi layers, obviously, the island insulation region may also be formed by a single zone. In alternative embodiments, the island insulation zone may also consist of insulating material or of a groove wholly or over part of the thickness. As is evident from the plan view of FIG. 2, the island 10 in the present example is substantially rectangular, but it will be obvious that this is not necessary. The JFET T$_3$ comprises a gate region 18 in the form of a p-type zone which extends along the edge of the island 10, in this case along the bottom edge of the rectangular island 10, adjoining a portion 17d of the island insulation. The gate 18 is separated from the island insulation portion 17d by the interposed region 10d which is substantially of the n-type and belongs to the source region of the JFET. In the present example, the gate region 18 extends laterally through the width of the rectangular island between two mutually opposing portions of the island insulation. As is evident from FIG. 2, the gate 18 divides the island 10 into two portions, a first portion comprising the source 15 of the JFET and a second portion in which the circuit elements of the block 3 are provided. The former portion 10d with the zone 15 is very small compared with the second portion and is connected to the cathode of the diode which is situated in its entirety next to the rectangular island.

The gate region may be formed by a buried p+ layer between the epi layer and the substrate, the channel of the JFET extending between the buried layer and the surface 6. In the present example, the gate region 18 comprises a p-type surface zone which extends from the surface 6 over part of the thickness of the epi layer 7 into the layer 7, so that the channel 16 formed by a non-redoped portion of the epi layer remains between the surface zone 18 and the substrate 9. The zone 18 is connected to the island insulation zone 17 at its edges and, via said zone, to the substrate, so that no separate gate connection is necessary.

To increase the voltage at which breakdown occurs, for example at the pn junction between the epi layer and the island insulation 17 and/or gate 18, the RESURF principle (REduced SURface Field) known from the literature is used in the present embodiment. According to this principle, electric fields are reduced at the surface where they have the highest values in that the epi layer is depleted at least locally over its entire thickness at a voltage which is lower than the breakdown voltage. The pn junction 8 between the epi layer and the substrate is reverse-biased for the purpose of this depletion. When the depletion takes place from the pn junction 8 only, calculations show that the product Nd of the doping concentration and the thickness of the epi layer must not be greater than approximately $10^{12}$ atoms.cm$^{-2}$. This value is too low for a number of applications, and a higher product Nd is preferred, as in the present example, in which the product Nd is approximately $1.5 \times 10^{12}$. To render it possible to use the RESURF principle nevertheless, the epi layer is depleted not only from the substrate side but aim from the upper side, for which purpose the island insulation region 17 is provided with a breakdown voltage raising ring 19 of the p type at least at the high-voltage side of the island. During operation the zone 19 is negatively biased relative to the epi layer 7, so that the portion of the epi layer lying below the zone 19 is depleted not only from the substrate but also from the zone 19 at the surface. The zone 19 may be formed by a coherent zone in the case of a sufficiently low doping (for example, approximately $10^{12}$ atoms per cm$^2$). In other cases, for example, when the zone 19 is manufactured in the same process steps as a zone of one of the circuit elements, a higher doping concentration may be desirable and it may be advantageous to provide the zone 19 in the form of a number of laterally separated partial zones, three of which are indicated in the drawing: 19a, 19b, 19c. The partial zones 19a, b and c extend along part of the circumference of the island 10 and along an edge of the gate 18 of the JFET which faces the portion of the island which comprises the high-voltage circuit 3. The portion of the island comprising the source 15 of the JFET and separated from the rest of the island by the field effect action of the JFET in the case of a high voltage is not provided with the breakdown voltage raising zone 19, as is evident from FIGS. 2 and 3, so that comparatively much space is saved. This aspect forms the subject of patent application Ser. No. 094,803, filed Jul. 20, 1993 and entitled "Semiconductor device", the contents of which are incorporated in the present Application by reference. The source 15 is connected to the n+ zone 14 of the diode which in this embodiment is provided in a separate island 11. The connection 20 indicated only diagrammatically in the drawing may be formed in usual manner, in view of the absence of high-voltage crossings, in that contact holes are etched into the oxide layer at the surface 6 (not shown in the drawing), and in that a conductor track is formed from a conducting layer deposited on this oxide layer, which track forms the connection between the zones 14 and 15.

Circuit elements which are known per se may be provided in the island 10, such as bipolar transistors of which one is shown in FIG. 3 by way of example. This transistor, referenced T$_4$, is depicted only diagrammatically and comprises an n-type emitter 21, a p-type base 22, and an n-type collector 23. The collector comprises an n+-type buried collector layer 23a and an adjoining n+-type contact zone 23b. Besides such transistors, obviously, other circuit elements may be provided in the island 10, such as MOS transistors of the n and/or p type, or double-diffused MOS transistors (DMOST), or non-active circuit elements such as resistors and capacitors. The device may be manufactured in a manner known per se. Various options are available for providing the gate electrode 18 subject to the desired value of the pinch-off voltage. Thus the gate region 18 may be manufactured simultaneously with the base 22 of transistor T$_4$. When a lower pinch-off voltage is required, however, the diffusion or implantation of the surface zone (or of the buried zone) of the island insulation region 17 may alternatively be used for the gate region 18.

Since the JFET T$_3$ is accommodated entirely in the edge of the high-voltage island 10, a very compact configuration is obtained which occupies comparatively little space. In addition, no connections crossing the island insulation are required for the high voltage at the JFET drain.

Figure 4:
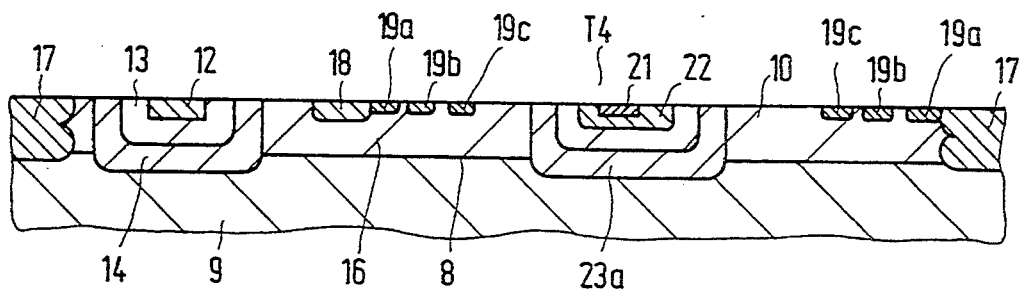
FIG. 4 is a corresponding cross-section of a second embodiment of an integrated circuit according to the invention.

FIG. 4 is a cross-section of a modification of the device shown in FIGS. 1 and 2, in which the diode is not provided in a separate island 11, as in FIG. 3, but is entirely accommodated in the island 10 together with the JFET, whereby additional space can be saved. The island insulation 17 to the left of the diode 12, 13 now forms part of the island insulation of the high-voltage island 10, but nevertheless it is not provided with the breakdown voltage raising rings 19 because the portion of the island 10 comprising the diode is screened from the high voltages by the JFET also in this case in the manner described above.

Figure 5:
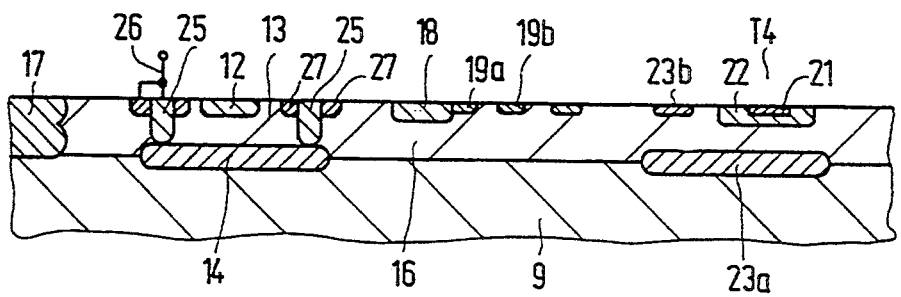
FIG. 5 is a cross-section of a third embodiment of an integrated semiconductor circuit according to the invention.

In the embodiments described here, the anode 12 of the diode is surrounded by a cup-shaped, highly doped zone which is entirely of the n type. For the manufacture of the upright walls of the cup, a deep n diffusion (or implantation) is necessary, extending from the surface down to the buried n zone. Instead of an n-type zone for the upright walls, a p-type zone may alternatively be used, for example, when no deep n diffusion is available in the process. FIG. 5 shows a cross-section of a portion of such a device in which the anode 12 is surrounded by a highly doped cup-shaped zone with an n-type bottom 14 and a p-type upright wall 25. This zone is short-circuited with the cathode 13 by the contact 26, for which purpose a highly doped n-type zone 27 is provided next to the zone 25. The zone 27 at the same time acts as a channel stopper which prevents channeling and/or punch-through between the p-type zones 12 and 25. The zone 25 adjoins the buried n-type zone 14 and is insulated thereby from the substrate 9. The collector connection 23b of the bipolar transistor T₄ is formed by a shallow zone in the embodiment of FIG. 5. Otherwise, the device may be constructed in an identical manner as the device of FIG. 4.

It will be obvious that the invention is not limited to the embodiments given here, but that many more variations are possible to those skilled in the an within the scope of the invention. Thus the diode D may alternatively be provided in the form of a transistor structure in which an n-type emitter zone short-circuited with the p-type zone is provided in the p-type zone 12. It is also possible for the diode to form, instead of an independent circuit element, only a part of a larger circuit element such as a transistor, where the zone 12 forms the base, the zone 13/14 the collector, and an n-type zone provided in the base the emitter. The gate electrode of the JFET, which in the embodiment of FIG. 2 extends only along one side of the rectangular island 10, may alternatively extend further, for example, along three sides of the rectangle. In that case the gate has a U-shape whose ends may connected to the island insulation 17. Furthermore, the conductivity types in the described embodiments may be reversed.

We claim:

1. An integrated semiconductor circuit comprising a semiconductor body with a layer-shaped region of a first conductivity type adjoining a surface and bounded at a side remote from the surface by a substrate region of a second conductivity type opposite to the first conductivity type, at least one insulated island being formed in the layer-shaped region with at least one circuit element therein comprising at least a diode with a first main electrode region comprising a surface zone of the second conductivity type provided in the layer-shaped region and with a second main electrode region of the first conductivity type comprising a portion of the layer-shaped region adjoining the first main electrode region and connected to a source region of a junction field effect transistor (JFET) whose channel is formed in a portion of the layer-shaped region situated adjacent the diode, characterized in that said junction field effect transistor comprises a drain region which is formed in a semiconductor island which forms a zone of at least one further circuit element and which is laterally bounded by an island insulation region, said junction field effect transistor comprising a gate region of the second conductivity type extending at an edge of the island and being separated from an adjacent portion of the island insulation region at least partly by an interposed region of the first conductivity type which is a part of the source region of said JFET, the gate region locally adjoining the island insulation region and in conjunction therewith dividing the semiconductor island into two portions capable of being isolated from one another, and the gate region of said junction field effect transistor comprising a surface zone of the second conductivity type which extends from the surface into the layer-shaped region of the first conductivity type which extends from the surface into the layer-shaped region of the first conductivity type over part of the thickness of this region and which is connected to the substrate of the second conductivity type via adjoining portions of the island insulation region which are formed by a zone of the second conductivity type extending throughout the entire thickness of the layer-shaped region.

2. A semiconductor circuit as claimed in claim 1, characterized in that the layer-shaped region of the first conductivity type is formed by an epitaxial layer provided on the substrate, the zone of the second conductivity type which forms part of the island insulation region and extends throughout the entire thickness of the layer-shaped region comprising a zone provided the surface and from a buried zone provided at the interface between the substrate and the epitaxial layer.

3. A semiconductor circuit as claimed in claim 1, characterized in that below the surface zone of the second conductivity type forming the first main electrode region of the diode, as seen at the surface, a zone of the first conductivity type is provided at the interface between the substrate and the layer-shaped surface region having a higher doping concentration than the layer-shaped region, so as to extend into the layer-shaped region at most over only part of the thickness of said layer-shaped region.

4. A semiconductor circuit as claimed in claim 3, characterized in that the surface zone of the second conductivity type forming the first main electrode region of the diode is surrounded, as seen at the surface, in the layer-shaped region by an annular zone of the first conductivity type having a higher doping concentration than that of the layer-shaped region.

5. A semiconductor circuit as claimed in claim 3, characterized in that the surface zone of the second conductivity type forming the first main electrode region of the diode is surrounded in the layer-shaped region, as seen at the surface, by a zone of the second conductivity type which is electrically connected to the layer-shaped region of the first conductivity type, and is separated from the substrate by the zone of the first conductivity type provided at the interface between the substrate and the layer-shaped region.

6. A semiconductor circuit as claimed in claim 1, characterized in that the island insulation region is provided, at the edge adjoining the semiconductor island, with a breakdown voltage increasing ring which extends along the circumference of a portion of the semiconductor island situated at the drain side of the JFET and along the edge of the gate region facing towards the drain region.

7. A semiconductor circuit as claimed in claim 1, characterized in that the semiconductor island is substantially rectangular while, seen at the surface, the gate region of the transistor extends parallel to one of the sides of the rectangle in the island.

8. A semiconductor circuit as claimed in claim 1, characterized in that the diode and the further circuit element are both provided in said semiconductor island.

* * * * *